United States Patent [19]
La Rosa

[11] Patent Number: 6,094,394
[45] Date of Patent: Jul. 25, 2000

[54] SENSE AMPLIFIER FOR NON-VOLATILE MEMORY DEVICES

[75] Inventor: Francesco La Rosa, Catania, Italy

[73] Assignee: STMicroelectronics S.r.l., Agrate Brianza, Italy

[21] Appl. No.: 09/256,603

[22] Filed: Feb. 23, 1999

[30] Foreign Application Priority Data

Feb. 23, 1998 [IT] Italy ................................ MI98A0352

[51] Int. Cl.[7] ....................................................... G11C 7/02
[52] U.S. Cl. ................. 365/207; 365/185.2; 365/185.21; 365/185.22
[58] Field of Search ........................... 365/185.21, 185.2, 365/185.22, 207

[56] References Cited

U.S. PATENT DOCUMENTS

| | | | |
|---|---|---|---|
| 5,432,746 | 7/1995 | Guedj | 365/202 |
| 5,544,114 | 8/1996 | Gaultier et al. | 365/202 |
| 5,748,534 | 5/1998 | Dunlap et al. | 365/185.21 |

*Primary Examiner*—David Nelms
*Assistant Examiner*—Connie C. Yoha
*Attorney, Agent, or Firm*—Jenkens & Gilchrist, P.C.; Theodore E. Galanthay

[57] ABSTRACT

A static sense amplifier, particularly for non-volatile memories, is disclosed. The static sense amplifier includes a differential stage having non-inverting and inverting input terminals respectively connected to a reference branch and to a matrix branch of a matrix of memory cells, and a feedback loop coupled between the output of the differential stage and the inverting input terminal thereof. The feedback loop includes a pull-up device having a control terminal driven by the output of the differential stage and a terminal connected to the inverting input terminal of the differential stage.

17 Claims, 8 Drawing Sheets

SENSE AMPLIFIER FOR NON-VOLATILE MEMORY DEVICES

BACKGROUND OF THE INVENTION

1. Technical Field of the Invention

The present invention relates to a static sense amplifier having feedback, particularly for non-volatile memories.

More particularly, the present invention relates to a feedback static sense amplifier for non-volatile memories such as EPROMs, EEPROMs and FLASH EEPROMs.

2. Background of the Relevant Art

In order to correctly read the data item from a memory cell from a memory matrix, it is known to compare the data item read from the memory matrix cell with the data item read from a reference matrix cell, so as to detect the difference between a programmed cell and a non-programmed cell.

For this purpose, memory matrices are usually preset so that a reading of the data item from a memory cell is matched by a reading of an amount of current that flows across a reference matrix cell. The differential between the two readings determines the particular data item read.

Referring to FIGS. 1 and 2, there is shown conventional memory read circuits including a reference branch, i.e., a reference bitline, designated by the reference numeral 1, and a corresponding bitline, designated by the reference numeral 2, which is the bitline to which the memory cells to be read are coupled.

The reference numeral 3 designates bitline selection devices, while the reference numeral 4 designates devices for biasing the bitlines, i.e., for precharging the bitlines.

The reference numeral 5 designates a sense amplifier circuit which is adapted to read the data of the memory cells by comparing the current that flows across the memory cell to be read with the current that flows across a corresponding reference cell.

The reference branch of the conventional read circuits includes transistors M1, M3, M7 and M9, while the memory cell branch of the conventional read circuits includes transistors M2, M4, M6 and M10, as shown in FIGS. 1 and 2.

A driving signal is sent to the gate terminals of the transistors M3 and M4 to charge the reference bitline 1 and the memory cell bitline 2. The signals sent to the transistors M3 and M4 are REF-CASC and CASC, respectively.

Further, a transistor M5 is connected so as to receive at its gate terminal the signal REF-CASC. The source terminal of transistor M5 is connected to the drain terminal of the transistor M3.

In a similar manner, transistor M6 is connected in the memory cell branch of the read circuit and receives the signal CASC at its gate terminal.

The sense amplifier 5 includes a differential amplifier 6 which receives the signals REFSIDE and MATSIDE at its noninverting and inverting terminals, respectfully. Signals REFSIDE and MATSIDE are signals taken from the reference branch and memory cell branch of the memory read circuitry, respectively. The output of the differential amplifier 6 is a signal DIFFOUT which drives a pair of series-connected inverters 7 and 8, the output of which is a signal designated DATA.

The function of the transistor M6 is to limit the oscillation of the node MATSIDE when the current that flows in the matrix side or memory cell branch of the memory read circuit, designated by Icell, is greater than the reference current Iref that flows in the reference side branch of the memory read circuit. This prevents the cascode device from entering the linear region, thereby maintaining the correct voltage level on the bitline 2.

Another important role of the transistor M6 is to shorten the recovery time of the node MATSIDE during the transient that follows the selection of the new bitline 2.

Specifically, when a column address changes, the previously selected bitline 2 is in fact deselected and a new bitline 2 (not shown) is connected to the input YMS of the sense amplifier 5. The selection and connection of the new bitline 2 (which is assumed not to be charged) causes the node YMS to fall from its existing operating level due to charge sharing with the high capacitive load of the new bitline 2. The amount of charge appearing on node MATSIDE also falls in response to the fall in charge appearing on the node YMS.

This fall in the amount of charge appearing on nodes YMS and MATSIDE is limited by the transistor M6. Directly after the selection of the new bitline 2 and corresponding drop in charge on nodes YMS and MATSIDE, the charge appearing thereon begins to rise.

During this charge transient, the current is supplied to nodes MATSIDE and YMS by the transistor M2 (whose current is constant because it is the reference current Iref mirrored by the transistor M1) and the transistor M6.

At this point, two possible situations must be considered.

First, consider the situation in which the current Icell that flows across the selected memory cell connected to bitline 2 is greater than the reference current Iref that flows across the corresponding reference cell connected to reference bitline 1 and is mirrored in transistor M2. In this case, the voltage appearing on node MATSIDE rises until the current that flows across the transistor M6 decreases. The current equation for node MATSIDE can be expressed as:

$$I(M6) = Icell - Iref,$$

where I(M6) is the current through transistor M6.

In this situation, the particular voltage level at which the node MATSIDE stabilizes is lower than the voltage level appearing on the node REFSIDE and depends on the control voltage of the gate terminal of the transistor M6.

In the circuit implementation shown in FIG. 1, the gate terminal of the transistor M6 is controlled, as mentioned, by the signal CASC, which is the same signal used to bias the bitline 2. On the other hand, in the conventional memory read circuit shown in FIG. 2, the transistor M6 is controlled by the node REFSIDE.

Since the operating voltage level of the node REFSIDE is greater than the voltage level appearing on the node CASC (the bitline biasing devices M3 and M4 work at saturation), the voltage level at which the node MATSIDE stabilizes in the circuit of FIG. 2 is greater than the corresponding voltage level of the node MATSIDE in the circuit of FIG. 1. FIGS. 4A and 4B illustrate the voltage characteristics of node MATSIDE during a portion of a memory read operation for the read circuits of FIGS. 1 and 2, respectively.

A second situation exists when the current Icell that flows across the selected memory cell is lower than the reference current Iref. In this situation, the operating point of the node MATSIDE is greater than the operating point of the node REFSIDE (the transistor M2 in this case enters the linear region). Before the node MATSIDE, during its recovery, reaches the node REFSIDE, the transistor M6 is shut off. The particular voltage level appearing on the node MATSIDE which results in the transistor M6 turning off depends on the signal used to control the gate terminal of transistor M6.

It should be noted that after the transistor M6 has switched to the off state, charging of the node MATSIDE becomes slower since it is charged only by the reference current Iref from transistor M2.

Accordingly, the circuit of FIG. 2 is more effective than the circuit of FIG. 1 in terms of the capability to provide faster recovery of the node MATSIDE. FIGS. 5a and 5b illustrate the recovery times for the read circuits of FIGS. 1 and 2, respectively.

The recovery time of the node MATSIDE can be considered as a critical time period for the speed performance of the sense amplifier 5 of a non-volatile memory.

SUMMARY OF THE INVENTION

The aim of the present invention is to provide a static sense amplifier, particularly for non-volatile memories, which is capable of reducing the recovery time of the node MATSIDE in order to enhance the performance of the sense amplifier.

Within the scope of this aim, an object of the present invention is to provide a static sense amplifier, particularly for a non-volatile memory, which is highly stable.

Another object of the present invention is to provide a static sense amplifier, particularly for non-volatile memories, in which the DC level of the node MATSIDE is greater than the corresponding DC level in conventional circuits.

Another object of the present invention is to provide a static sense amplifier, particularly for non-volatile memories, which is highly reliable and is relatively easy and inexpensive to manufacture.

This aim, these objects and others which will become apparent hereinafter by providing a feedback static sense amplifier, particularly for non-volatile memories, which utilizes a differential amplifier stage having non-inverting and inverting input terminals respectively connected to a reference branch and to a matrix branch of a matrix of memory cells. The present sense amplifier preferably employs a feedback loop between the output of the differential amplifier stage and the inverting input terminal thereof.

BRIEF DESCRIPTION OF THE DRAWINGS

Further characteristics and advantages of the present invention will become apparent from the following detailed description of preferred but not exclusive embodiments of the sense amplifier according to the invention, illustrated only by way of non-limitative example in the accompanying drawings, wherein:

FIG. 7b is a plot of the phase of the frequency response of the open-loop gain of the circuit of FIG. 3 at the three operating points considered in FIG. 7a.

DETAILED DESCRIPTION OF THE PREFERRED EMBODIMENTS

Figure 2:
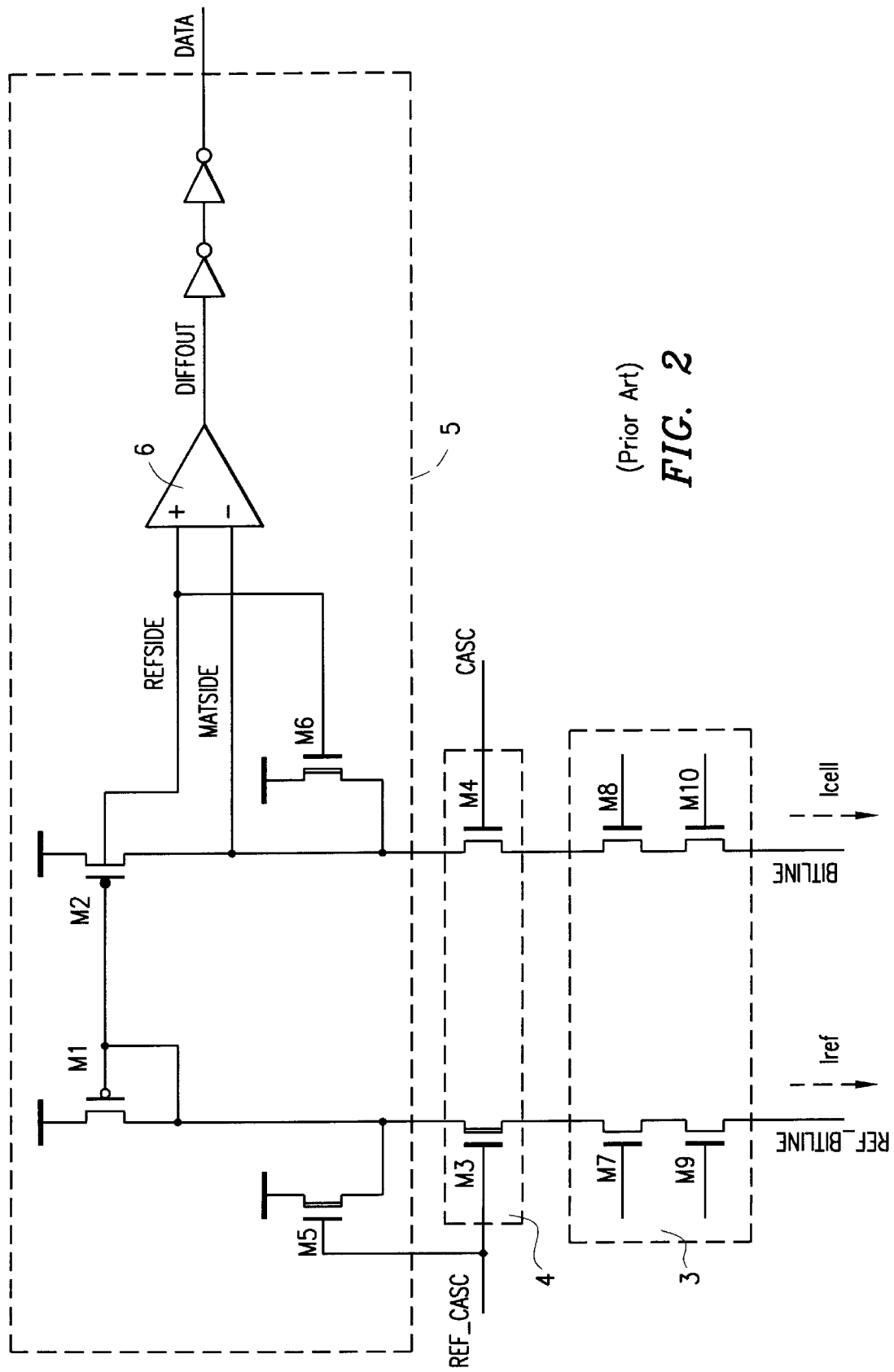
FIG. 2 is a circuit diagram of another conventional memory read circuit for a non-volatile memory device.
Figure 3:
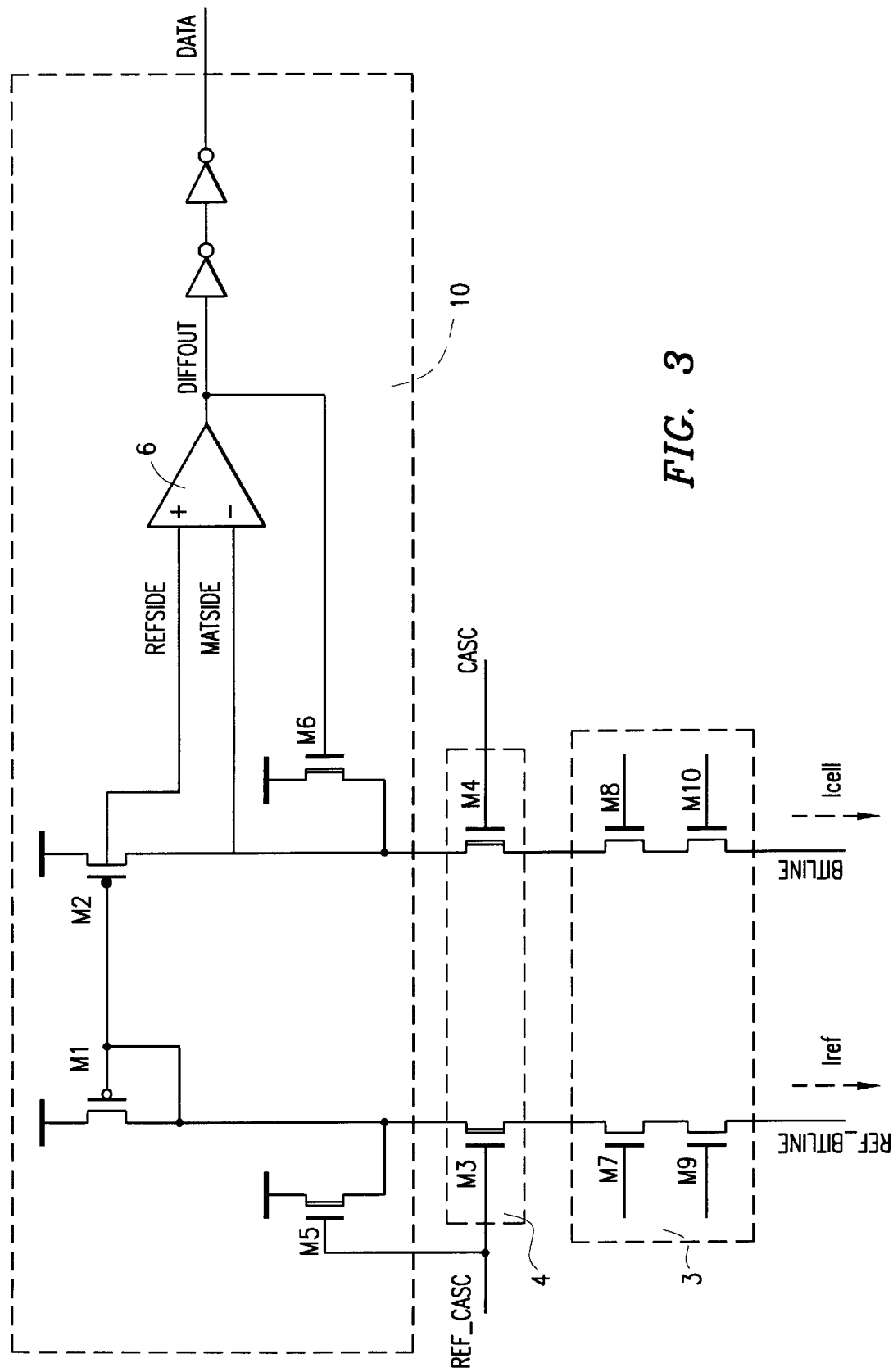
FIG. 3 is a diagram of a memory read circuit according to the present invention.

Referring to FIG. 3, there is shown a feedback static sense amplifier 10 according to the present invention. To facilitate understanding of the invention, the components of the circuit of FIG. 3 are assigned like reference numerals as the components of the circuits of FIGS. 1 and 2. In the sense amplifier 10 of FIG. 3, the transistor M6 thereof is controlled by the output of the differential amplifier stage 6.

In particular, the gate terminal of transistor M6 is connected to the output node of the differential amplifier stage 6, indicated by the signal DIFFOUT.

Figure 8:
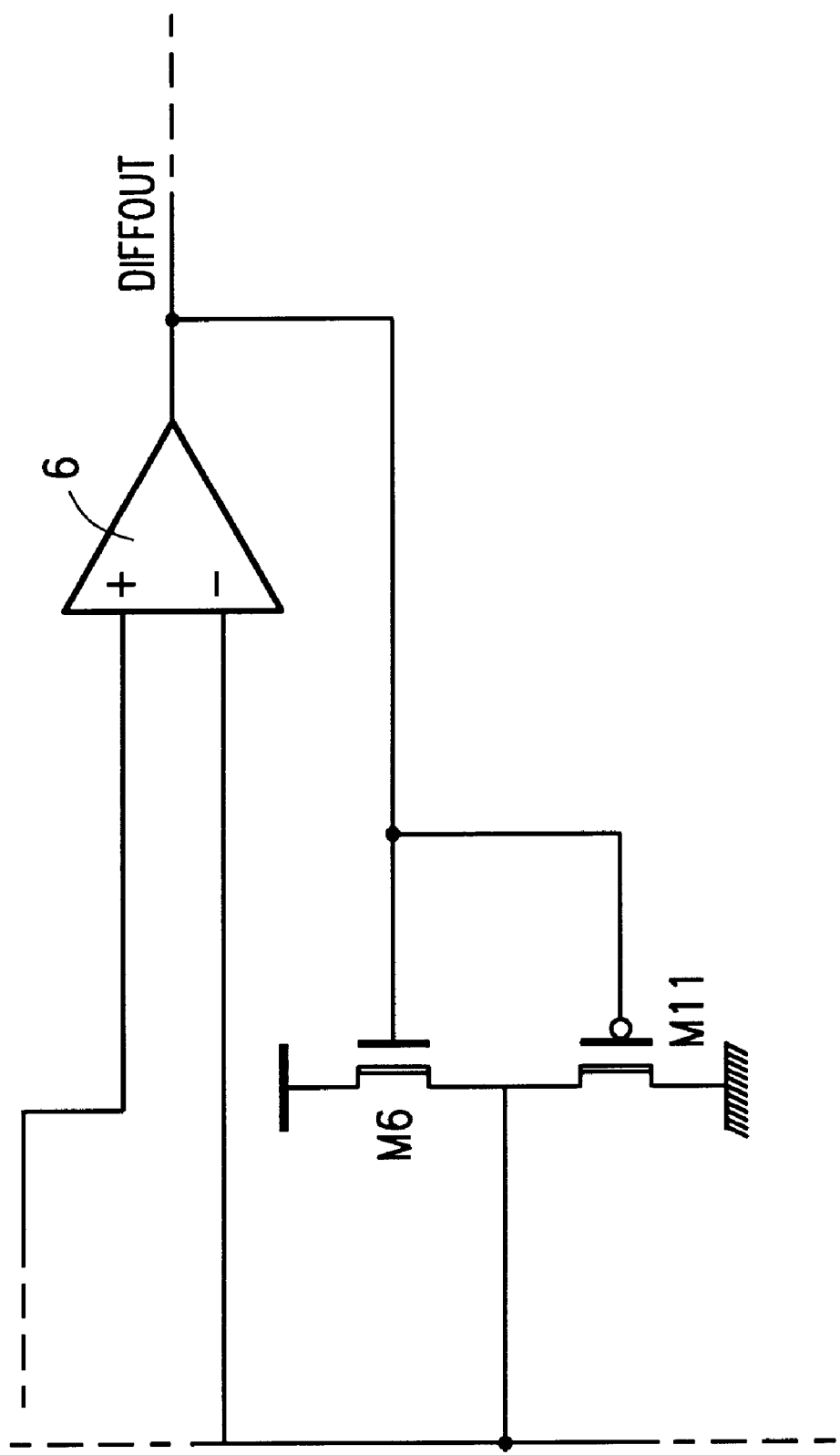
FIG. 8 is a circuit diagram of a second embodiment of the static sense amplifier according to the present invention.

In this way, transistor M6 forms a feedback loop between the output and the inverting input of the differential amplifier stage 6. It is possible to provide, in addition to field effect transistor M6, another field effect transistor (indicated in FIG. 8 by the reference numeral M11) of a P-channel type, connected between N-channel transistor M6 and ground and having its gate terminal driven by the output signal DIFFOUT of the differential amplifier stage 6.

The feedback loop is therefore created by at least one transistor arranged between the output node of the differential stage 6 and the inverting input terminal thereof.

The operation of the transistor M6 connected as shown in FIG. 3 will now be described with reference to the two situations already considered earlier with respect to the description of the conventional sense amplifier circuits of FIGS. 1 and 2.

In the first situation, in which the current Icell is higher than the reference current Iref, the operating point of the node MATSIDE is controlled by the above-described feedback. The difference in voltage between the node DIFFOUT and the node MATSIDE is such that transistor M6 provides current to the node MATSIDE based in part upon the transfer characteristic of the differential amplifier 6.

Figure 1:
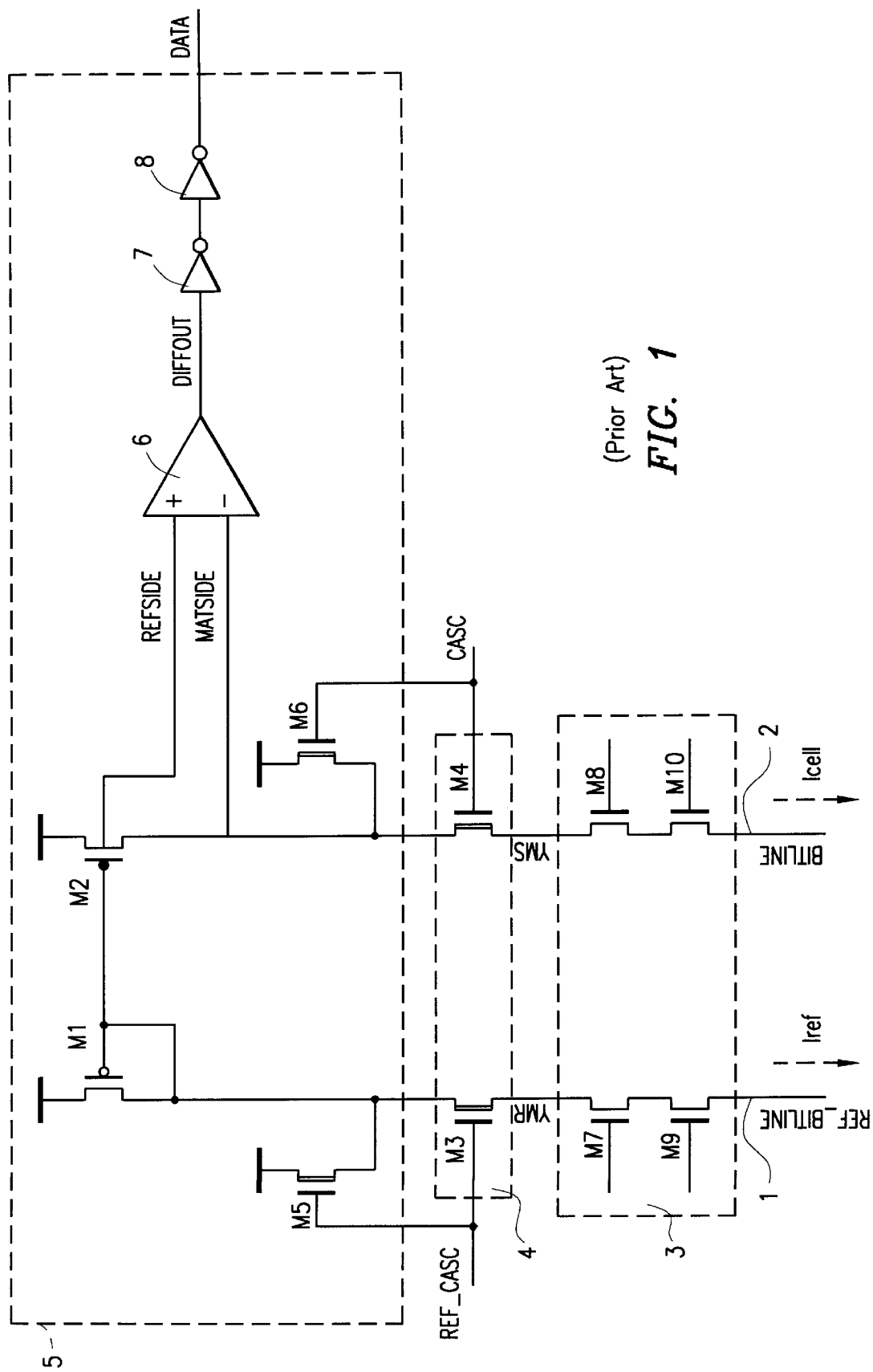
FIG. 1 is a circuit diagram of a conventional memory read circuit for a non-volatile memory device.
Figure 4A:
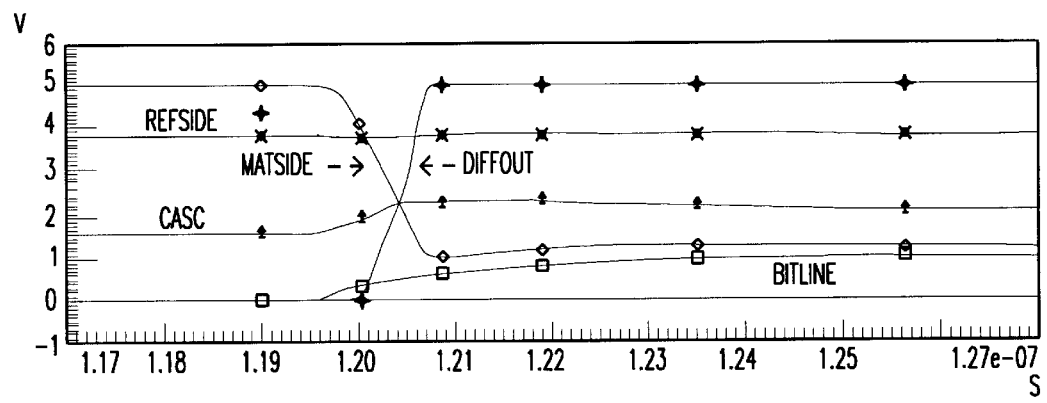
FIGS. 4a, 4b, and 4c are graphs which illustrate the voltage characteristics of signals internal to the read circuits of FIGS. 1, 2 and 3, respectively.
Figure 4B:
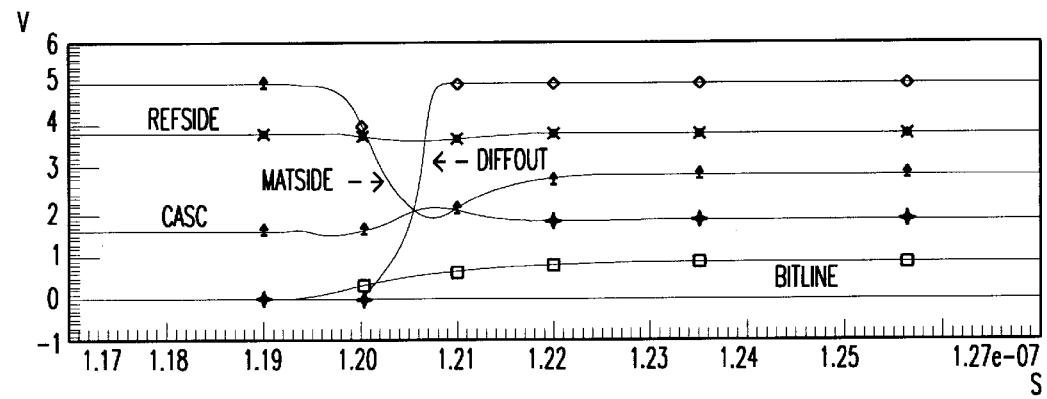
Figure 4C:
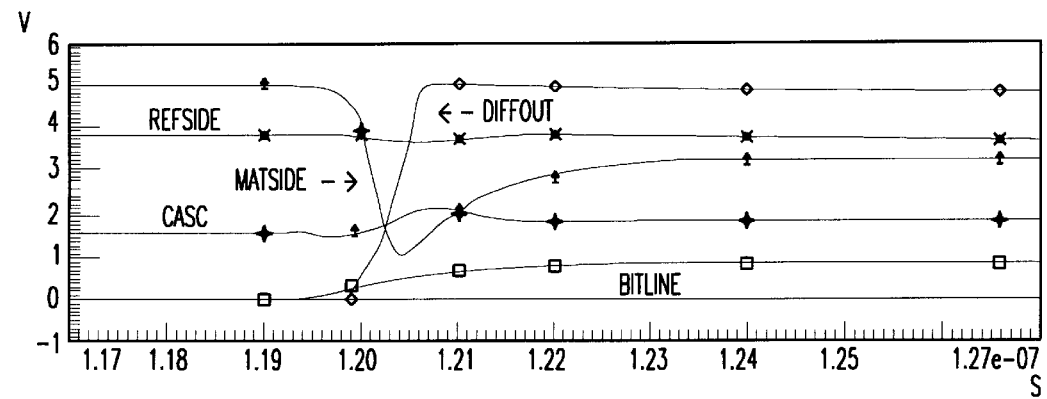

Since the level of the node DIFFOUT is approximately Vcc (i.e., the voltage level of the supply voltage), the voltage level to which the node MATSIDE stabilizes is greater than in the conventional circuits of FIGS. 1 and 2. FIG. 4c illustrates the voltage characteristics of sense amplifier 10 of the present invention.

The second situation is the one in which the current Icell of the selected memory cell is lower than the reference current Iref. Since the transistor M6 is controlled directly by the node DIFFOUT (which is approximately Vcc while the node MATSIDE is lower than the node REFSIDE), transistor M6 contributes to the recovery of the voltage level for node MATSIDE. When the voltage level of node MATSIDE reaches the voltage level of the node REFSIDE, transistor M6 is switched off in response to differential amplifier 6 changing state and transitioning output signal DIFFOUT from a high logic level to a low logic level.

Figure 5A:
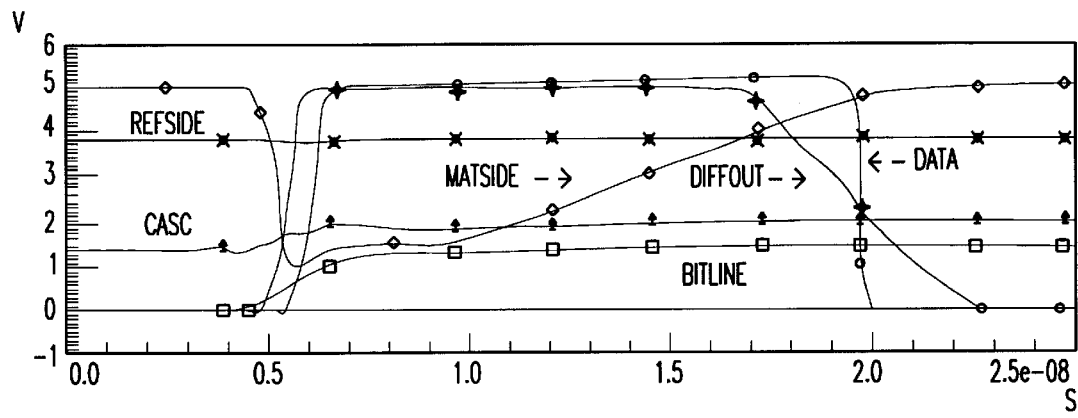
FIGS. 5a, 5b and 5c are graphs which illustrate the voltage characteristics of signals internal to the circuits of FIGS. 1, 2 and 3, respectively.
Figure 5B:
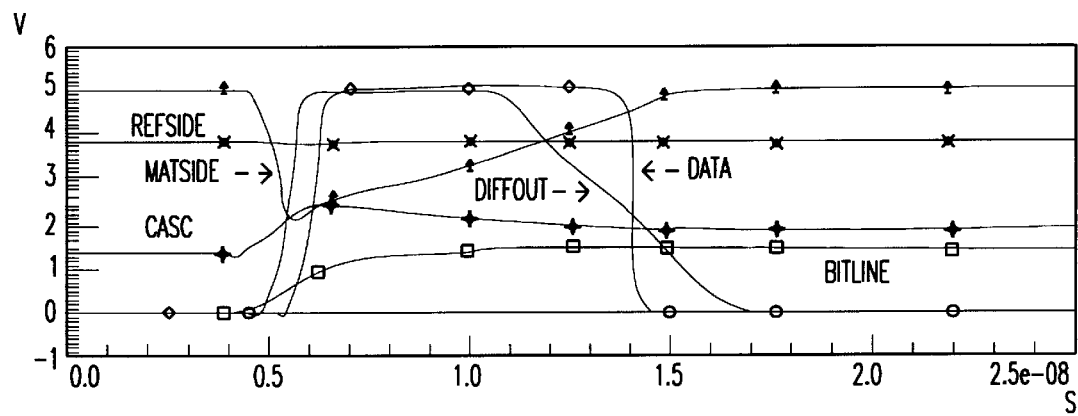
Figure 5C:
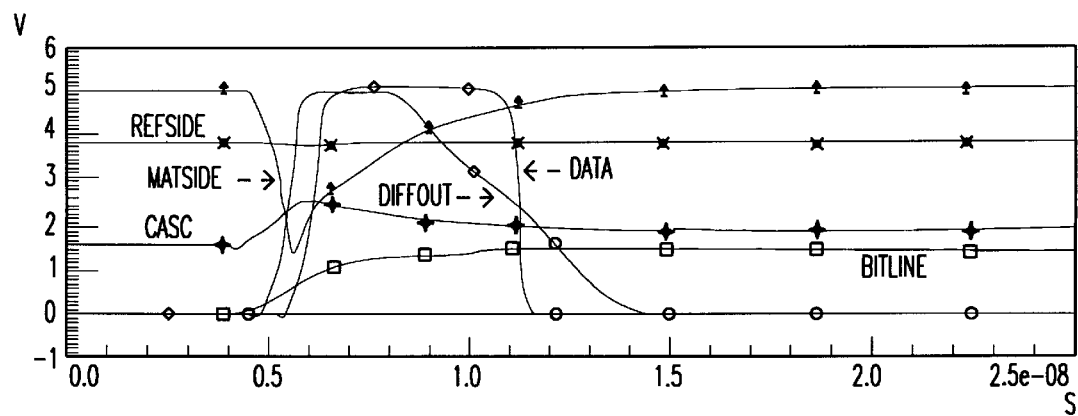

FIG. 5c shows the positive effect obtained by utilization of the feedback between the output of the differential amplifier 6 and its inverting input terminal relative to the conventional circuits of FIGS. 1 and 2. FIG. 5c shows that the node MATSIDE stabilizes at the high logic level much faster than the stabilization times for the circuits of FIGS. 1 and 2, whose timing characteristics are shown in FIGS. 5a and 5b, respectively. In this case, therefore, data sensing by the sense amplifier 10 is much faster, as clearly shown by the comparison between the graphs of FIGS. 5a–5c.

Figure 6A:
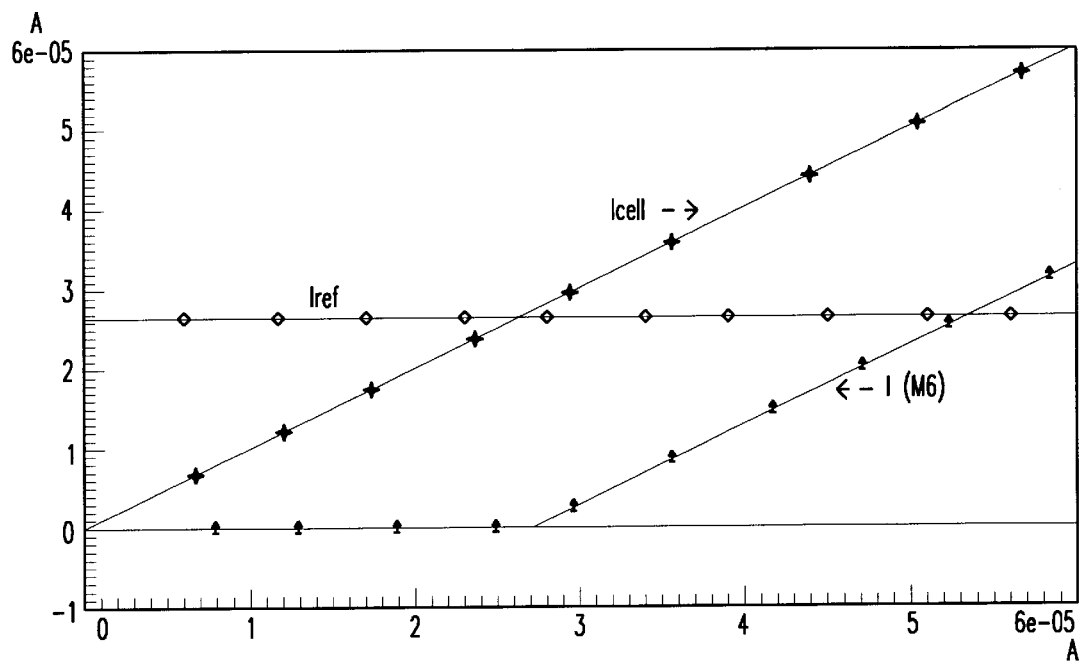
FIG. 6a is a plot of the current characteristic of the circuit of FIG. 3.
Figure 6B:
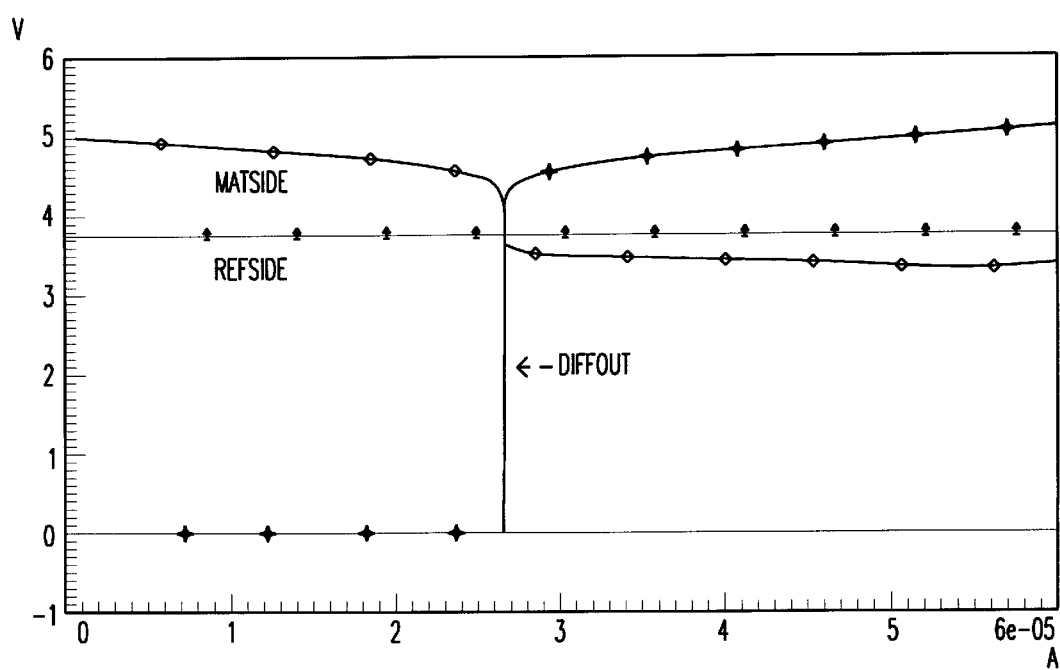
FIG. 6b is a plot of the voltage characteristic of the circuit of FIG. 3.
Figure 7A:
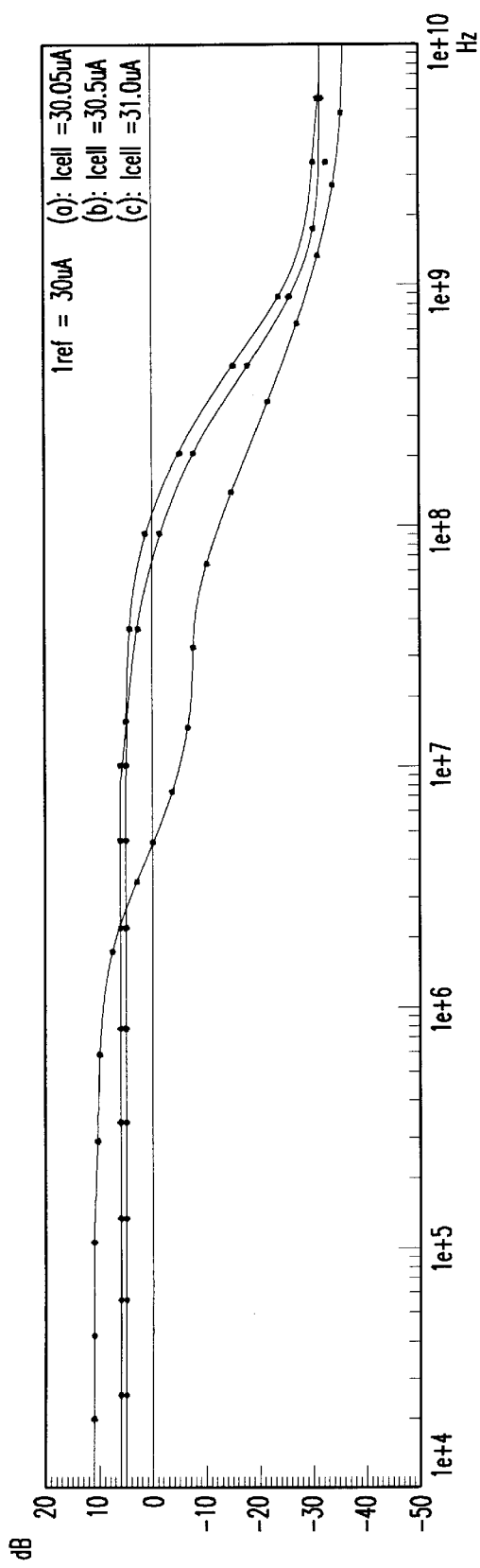
FIG. 7a is a graph of the magnitude of the frequency response of the open-loop gain of the circuit of FIG. 3 at three different operating points.
Figure 7B:
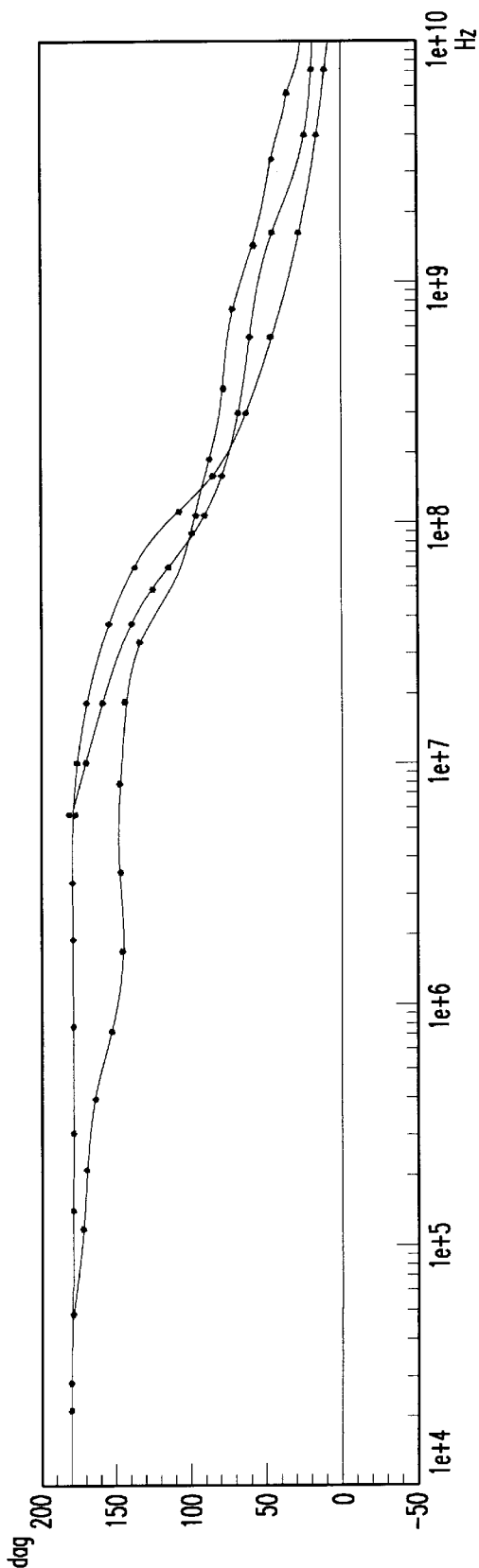

FIGS. 6a–b plot the current/voltage characteristics of the circuit according to the present invention. FIGS. 7a–7b plot the magnitude and the phase of the frequency response of the open-loop gain of sense amplifier 10 at three operating points (three different values for the current Icell-Iref). The high phase margin ensures very high stability of the static sense amplifier 10.

In practice it has been observed that the static sense amplifier 10 according to the present invention fully achieves the intended aim and objects by providing decreased recovery times for which the node MATSIDE rises, which thereupon provides for faster capture of the data item read from a memory cell. As a result, sense amplifier 10 of the present invention increases the speed of the entire memory read cycle.

Although the preferred embodiments of the present invention have been illustrated in the accompanying drawings and described in the foregoing detailed description, it will be understood that the invention is not limited to the embodiments disclosed, but is capable of numerous rearrangements, modifications and substitutions without departing from the spirit of the invention as set forth and defined by the following claims.

What is claimed is:

1. A sense amplifier circuit for a semiconductor memory device, comprising:
    a differential stage having non-inverting and inverting input terminals respectively connected to a reference branch and to a matrix branch of a memory matrix of the semiconductor memory device and an output terminal, the differential stage generating an output signal on the output terminal representative of a difference between a voltage appearing on the inverting input terminal and a voltage appearing on the non-inverting input terminal; and
    a feedback loop connected between the output of the differential stage and the inverting input terminal thereof and responsive to the output signal on the output terminal of the differential stage, for pulling a voltage appearing on the inverting input terminal towards a supply voltage during a sensing operation wherein the differential stage compares a voltage appearing on the inverting input terminal corresponding to a data value from a selected memory cell in the memory matrix to a reference voltage appearing on the non-inverting input terminal corresponding to a reference value from the reference branch.

2. The sense amplifier according to claim 1, wherein: the feedback loop comprises at least one transistor which is connected between the output of the differential stage and the inverting input terminal thereof.

3. The sense amplifier according to claim 2, wherein: the at least one transistor comprises a first field effect transistor having a gate terminal connected to the output of the differential stage, a drain terminal connected to a supply voltage and a source terminal connected to the inverting input terminal of the differential stage so as to pull the voltage appearing on the inverting input terminal towards the supply voltage during the sensing operation based upon a value of the output of the differential stage.

4. The sense amplifier according to claim 3, further comprising:
    a second field effect transistor which is connected in series with the first field effect transistor, the gate terminal of the second field effect transistor being connected to the output of the differential stage, the source terminal of the second field effect transistor being connected to the inverting input terminal of the differential stage.

5. The sense amplifier according to claim 4, wherein:
    the first field effect transistor comprises an n-channel field effect transistor; and
    the second field effect transistor comprises a p-channel field effect transistor.

6. The sense amplifier according to claim 1, wherein: the sense amplifier comprises a static sense amplifier.

7. A sense amplifier for a semiconductor memory device, comprising:
    a first circuit, connected to a bitline of the semiconductor memory device, for comparing a voltage level appearing on the bitline corresponding to a data value stored in a selected memory cell of the semiconductor memory device to which the bit line is connected to a first reference voltage level, and for generating an output based upon the comparison representative of the data value stored in the selected memory cell of the semiconductor memory device; and
    a second circuit, responsive to the output of the first circuit, for pulling the bitline towards a second reference voltage level while the bitline is connected to the selected memory cell and the first circuit is comparing the voltage level appearing on the bitline to the first reference voltage level.

8. The sense amplifier of claim 7, wherein: the first circuit comprises a differential amplifier.

9. The sense amplifier of claim 7, wherein: the second circuit comprises a first transistor having a control terminal driven by the output of the first circuit, a first terminal connected to the first bitline, and a second terminal tied to the second reference voltage level.

10. The sense amplifier of claim 9, wherein: the first transistor comprises a field effect transistor.

11. The sense amplifier of claim 9, wherein: the second circuit further comprises a second transistor having a control terminal driven by the output of the first circuit, a first terminal connected to the first bitline and a second terminal tied to a third reference voltage level.

12. The sense amplifier of claim 11, wherein:
    the first transistor is a field effect transistor of a first conductivity type; and
    the second transistor is a field effect transistor of a second conductivity type that is different from the first conductivity type.

13. The sense amplifier of claim 11, wherein:
    the first transistor is an n-channel field effect transistor;
    the second transistor is a p-channel field effect transistor;
    the second reference voltage level is a first supply voltage; and
    the third reference voltage level is a ground potential.

14. A method of reading a data value from a memory cell of a semiconductor memory array, comprising the steps of:
    selecting a bitline corresponding to a memory cell to be read;

connecting a memory cell to the selected bit line;

comparing a voltage level appearing on the selected bitline to a voltage level appearing on a reference bitline;

modifying, during the step of comparing, the voltage level appearing on the selected bitline based upon the comparison; and driving an output of the semiconductor memory device to a value corresponding to the comparison of the voltage levels compared during the step of comparing.

15. The method of claim 14, wherein:

the step of modifying comprises the steps of charging the selected bitline with a first current and charging the selected bitline with a second current to pull the voltage appearing on the selected bitline towards the first supply voltage, the step of charging the selected bitline with the second current occurring only while the voltage level appearing on the selected bitline is determined to be less than the voltage level appearing on the reference bitline during the step of comparing.

16. The sense amplifier circuit of claim 2, wherein:

a control terminal of the at least one transistor is connected to the output of the differential stage so that the at least one transistor is turned on when the voltage appearing on the non-inverting terminal of the differential stage is greater than the voltage appearing on the inverting terminal of the differential stage and turned off when the voltage appearing on the non-inverting terminal of the differential stage is less than the voltage appearing on the inverting terminal of the differential stage.

17. The sense amplifier circuit of claim 9, wherein:

a control terminal of the first transistor is connected to the output of the first circuit so that the first transistor is turned on when the first reference voltage level is greater than the voltage appearing on the bitline and turned off turned on when the first reference voltage level is less than the voltage appearing on the bitline.

* * * * *